(12) United States Patent
Sano et al.

(10) Patent No.: US 9,946,164 B2
(45) Date of Patent: Apr. 17, 2018

(54) EXPOSURE APPARATUS AND METHOD OF MANUFACTURING ARTICLE

(71) Applicant: CANON KABUSHIKI KAISHA, Tokyo (JP)

(72) Inventors: Hirotaka Sano, Utsunomiya (JP); Tetsuya Yamamoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/177,701

(22) Filed: Jun. 9, 2016

(65) Prior Publication Data

US 2016/0370708 A1 Dec. 22, 2016

(30) Foreign Application Priority Data

Jun. 16, 2015 (JP) ................. 2015-121423

(51) Int. Cl.
*G03B 27/72* (2006.01)
*G03F 7/20* (2006.01)

(52) U.S. Cl.
CPC ................. *G03F 7/70558* (2013.01)

(58) Field of Classification Search
CPC . G03F 7/70558; G03F 7/70191; G03F 7/7055
USPC .................................................. 355/71, 67
See application file for complete search history.

(56) References Cited

U.S. PATENT DOCUMENTS 7,936,446 B2    5/2011    Hirano

FOREIGN PATENT DOCUMENTS

JP    04-229843 A    8/1992
JP    2008118062 A    5/2008

*Primary Examiner* — Peter B Kim
(74) *Attorney, Agent, or Firm* — Rossi, Kimms & McDowell LLP

(57) ABSTRACT

The present invention provides an exposure apparatus including a rotation shutter, and a control unit configured to control a rotational speed of the rotation shutter so as to match an exposure amount on a substrate with a target exposure amount in exposure processing for a shot region, based on first information indicating a relationship between a rotational speed of the rotation shutter and an exposure amount on the substrate when rotating the rotation shutter at the rotational speed without stopping rotation of the rotation shutter so as to make a shift from a first state in which the rotation shutter shields a light to a second state in which the rotation shutter passes the light and then back to the first state, wherein the control unit updates the first information based on second information concerning a change in the illuminance of light.

12 Claims, 11 Drawing Sheets

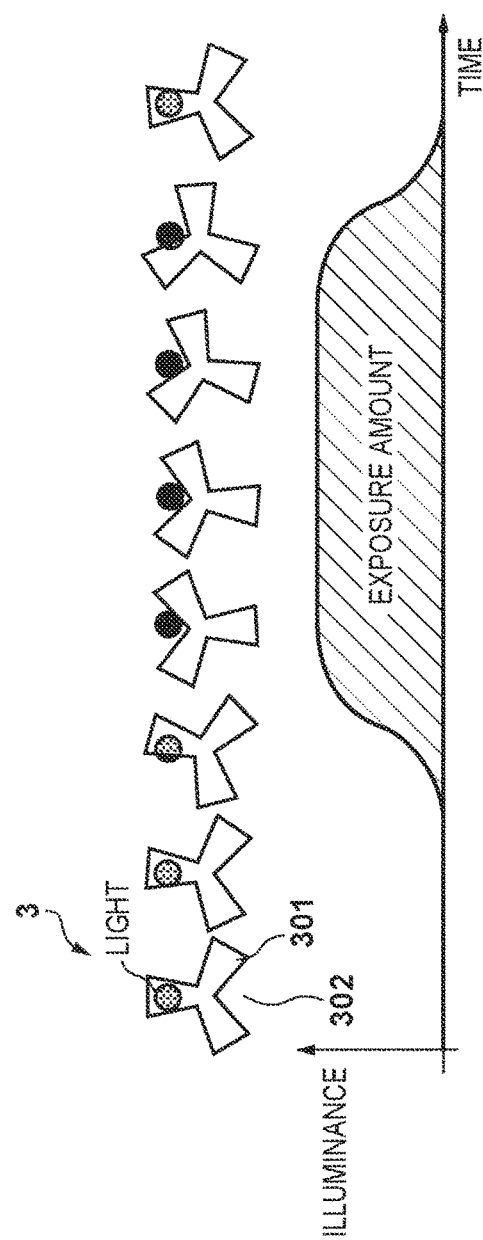

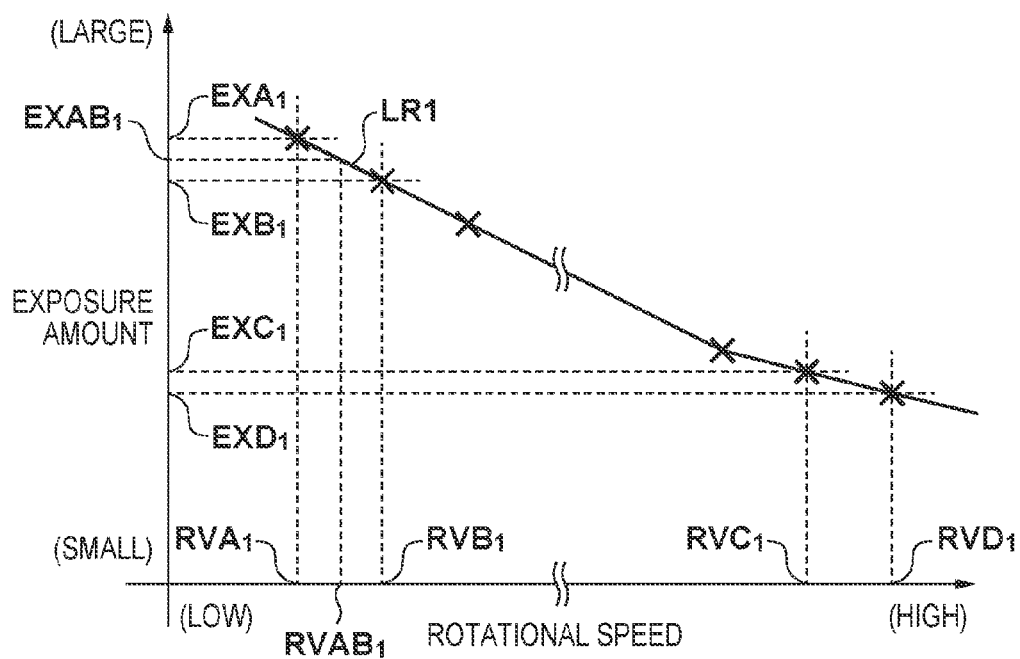

FIG. 5

| TB2 | |
|---|---|
| ROTATIONAL SPEED | EXPOSURE AMOUNT |
| $RVA_1$ | $EXA_2$ |
| $RVB_1$ | $EXB_2$ |
| ⋮ | ⋮ |
| $RVC_1$ | $EXC_2$ |
| $RVD_1$ | $EXD_2$ |

FIG. 6

| TB3 | |
|---|---|
| ROTATIONAL SPEED | EXPOSURE AMOUNT |
| $RVA_1$ | $EXA_3$ |
| $RVB_1$ | $EXB_3$ |
| ⋮ | ⋮ |
| $RVC_1$ | $EXC_3$ |
| $RVD_1$ | $EXD_3$ |

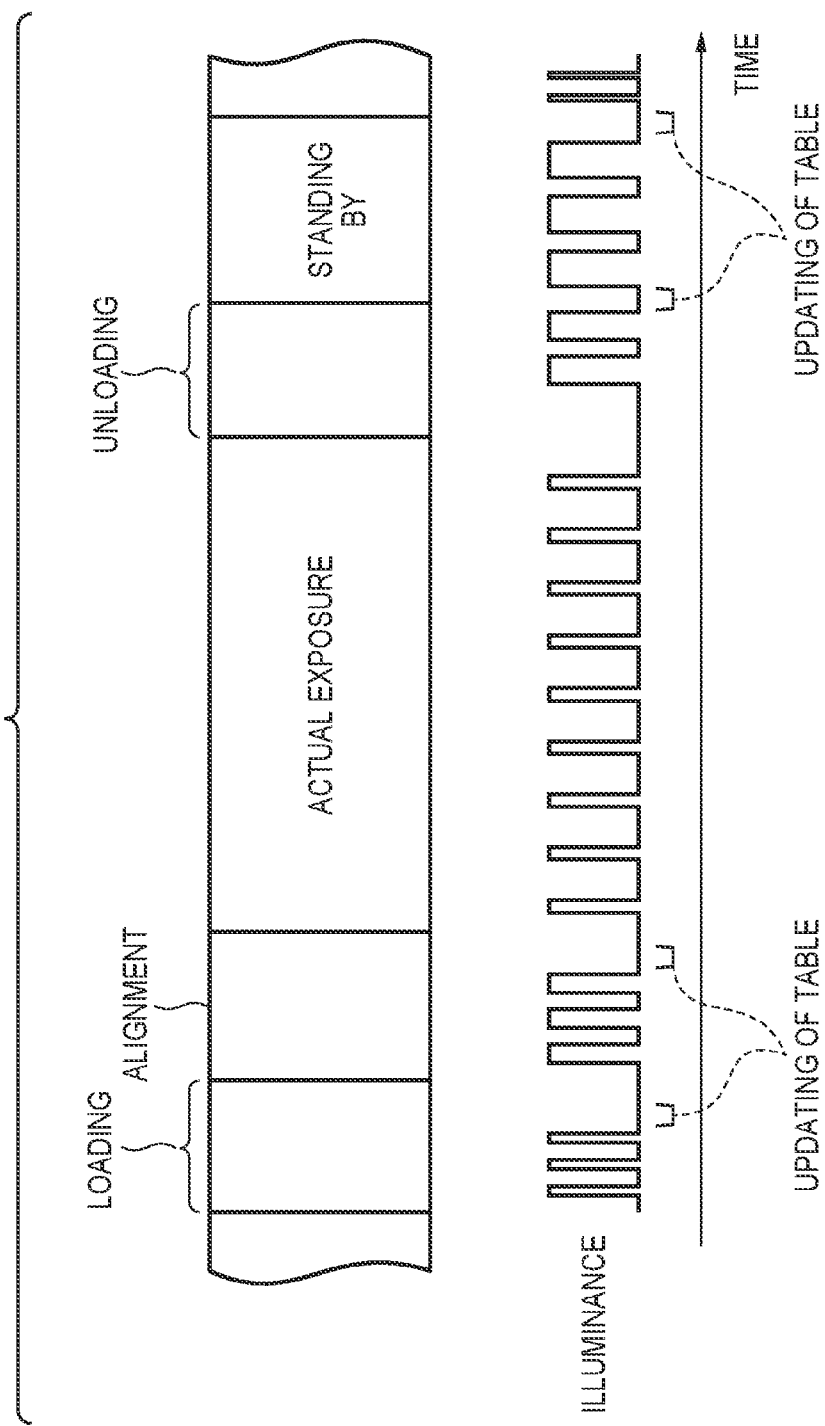

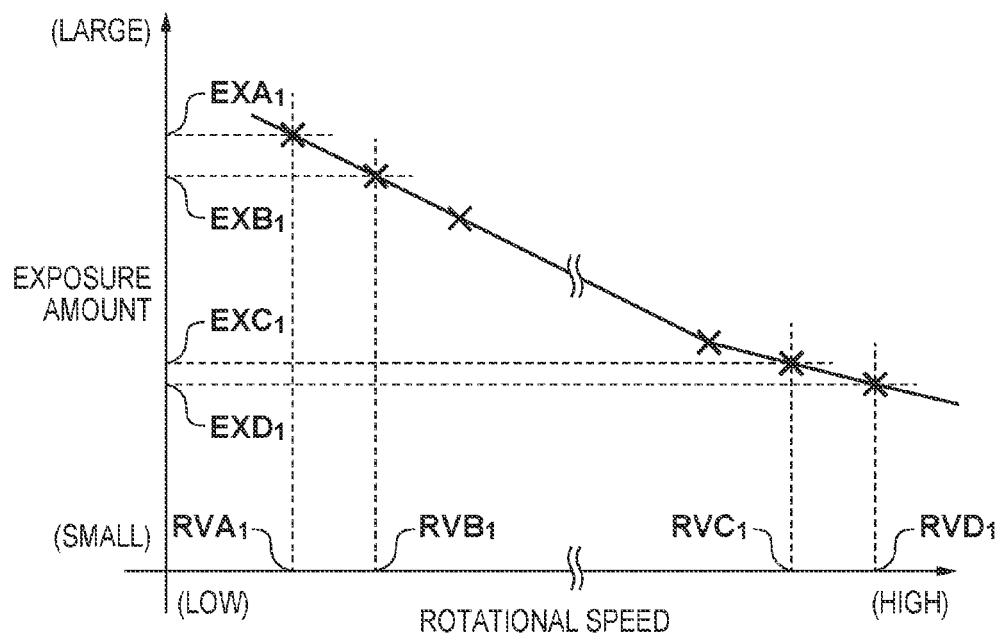

| TB4 | |
|---|---|
| ROTATIONAL SPEED | EXPOSURE AMOUNT |
| $RVA_1$ | $EXA_1" (= EXA_1 \times P)$ |
| $RVB_1$ | $EXB_1" (= EXB_1 \times P)$ |
| ⋮ | ⋮ |
| $RVC_1$ | $EXC_1" (= EXC_1 \times P)$ |
| $RVD_1$ | $EXD_1" (= EXD_1 \times P)$ |

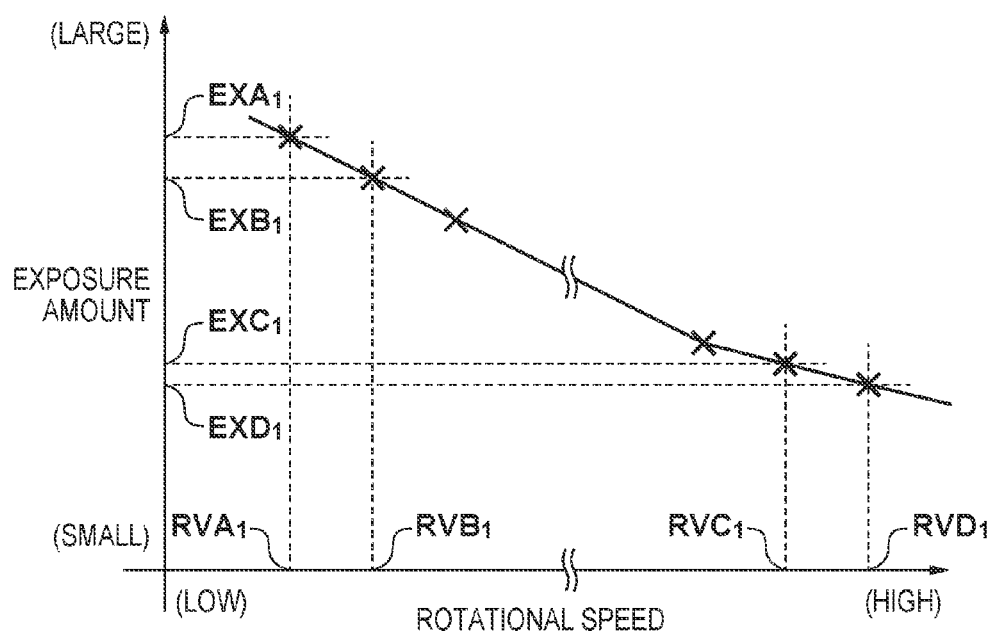

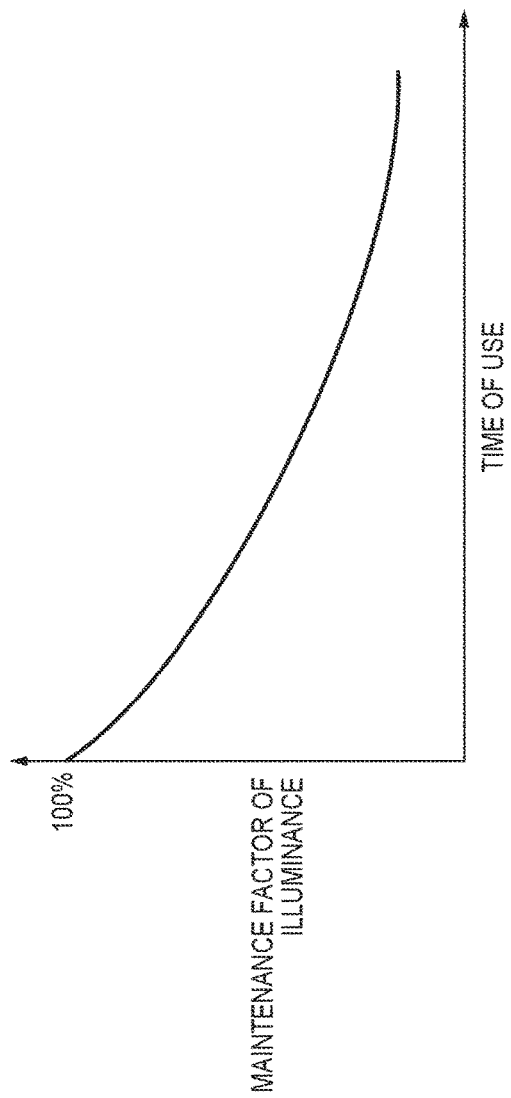

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

An exposure apparatus based on a stepper scheme (sequential exposure scheme) using an ultraviolet lamp uses a rotation shutter for implementing a function of turning ON/OFF exposure light from the ultraviolet lamp, that is, a function of controlling the incidence of light on a substrate. The rotation shutter is formed from a rotating body including light-shielding portions which shield light. The time during which exposure light enters a substrate is controlled by rotating the rotation shutter, thereby obtaining a target exposure amount.

As a mode of driving and controlling the rotation shutter, for example, an integrated exposure control mode is available. In the integrated exposure control mode, first of all, the rotation shutter is driven (rotated) to make a shift from a state (light-shielded state) in which exposure light is shielded to a state (light-transmitted state) in which exposure light is transmitted. In this light-transmitted state, the rotation shutter is stopped. Before the exposure amount reaches the target exposure amount, the rotation shutter is driven to make a shift from the light-transmitted state to the light-shielded state. In this case, the timing at which the driving of the rotation shutter starts is determined in consideration of exposure light entering a substrate until the shift from the light-transmitted state to the light-shielded state is complete, that is, an exposure amount. In the integrated exposure control mode, it is possible to accurately control an exposure amount. However, the rotation shutter must be driven twice per exposure process. It is therefore a challenge to shorten the time required for exposure processing.

In order to shorten the driving time of the rotation shutter, therefore, Japanese Patent Laid-Open No. 4-229843 has proposed a mode of continuously driving the rotation shutter without stopping it until the light-shielded state is restored after shifting to the light-transmitted state, that is, a so-called continuous driving mode. In the continuous driving mode, the relationship between the rotational speed of the rotation shutter and an exposure amount is obtained in advance, and the rotational speed of the rotation shutter is controlled to obtain a target exposure amount based on the obtained relationship.

As a technique associated with the driving and control of the rotation shutter, Japanese Patent Laid-Open No. 2008-118062 has proposed a technique of executing a low-speed exposure mode for the first substrate of a lot and executing a high-speed exposure mode for the second and subsequent substrates of the lot. In the low-speed exposure mode, while the intensity of exposure light entering a substrate is decreased, a pulse count corresponding to outputs from an optical sensor is counted, and the rotation shutter is closed when the pulse count reaches a target pulse count, and the open time of the rotation shutter is stored. In contrast to this, in the high-speed exposure mode, first of all, a target exposure light for the second and subsequent substrates is corrected from the open time of the rotation shutter, which is stored in the low-speed exposure mode, thereby calculating a final target exposure amount. The rotational speed of the rotation shutter is then decided to become the final target exposure amount based on an approximation function or table indicating the relationship between the rotational speed of the rotation shutter and an exposure amount, which is stored in a memory.

An ultraviolet lamp as a light source for exposure light, however, gradually decreases in illuminance obtained in accordance with the time of use. In the continuous driving mode disclosed in Japanese Patent Laid-Open No. 4-229843, therefore, the optimal rotational speed of the rotation shutter changes relative to a target exposure amount in accordance with the time of use of the ultraviolet lamp. As a consequence, in the continuous driving mode, the accuracy of an exposure amount based on the rotation shutter gradually decreases, and an actual exposure amount deviates from a target exposure amount, thereby failing to obtain a desired exposure result.

In order to avoid such a problem, the relationship between the rotational speed of the rotation shutter and an exposure amount may be obtained again by periodical maintenance to maintain the accuracy of an exposure amount based on the rotation shutter within a predetermined range. To maintain the accuracy of an exposure amount required recently, it is necessary to shorten a maintenance cycle. This leads to decreases in the operating rate of an exposure apparatus and productivity.

In addition, the technique disclosed in Japanese Patent Laid-Open No. 2008-118062 gives no consideration to the time of use of an ultraviolet lamp, that is, a decrease in the illuminance of exposure light. Even if, therefore, the rotational speed of the rotation shutter is decided by using the approximation function or table indicating the relationship between the rotational speed of the rotation shutter and an exposure amount, which is stored in the memory, a final target exposure amount cannot be obtained as the time of use of the ultraviolet lamp increases.

SUMMARY OF THE INVENTION

The present invention provides an exposure apparatus advantageous in satisfying both requirements for the accuracy of an exposure amount on a substrate and productivity.

According to one aspect of the present invention, there is provided an exposure apparatus which exposes a substrate, the apparatus including a rotation shutter including a light-shielding portion which shields light from a light source and configured to control incidence of the light onto the substrate, and a control unit configured to control a rotational speed of the rotation shutter so as to match an exposure amount on the substrate with a target exposure amount in exposure processing for a shot region on the substrate, based on first information indicating a relationship between a rotational speed of the rotation shutter and an exposure amount on the substrate when rotating the rotation shutter at the rotational speed without stopping rotation of the rotation shutter so as to make a shift from a first state in which the rotation shutter shields the light to a second state in which the rotation shutter passes the light and then back to the first state, wherein the control unit updates the first information based on second information concerning a change in the illuminance of light.

Further aspects of the present invention will become apparent from the following description of exemplary embodiments with reference to the attached drawings.

BRIEF DESCRIPTION OF THE DRAWINGS

FIG. 2 is a graph showing the relationship between the driven state of a rotation shutter and illuminance on a substrate in the continuous driving mode.

FIG. 3 is a graph showing an example of the relationship between the rotational speed of the rotation shutter and an exposure amount on a substrate.

FIG. 4 is a view showing an example of a table indicating the relationship between the rotational speed of the rotation shutter and an exposure amount on a substrate.

FIG. 5 is a view showing an example of a table indicating the relationship between the rotational speed of the rotation shutter and an exposure amount on a substrate.

FIG. 6 is a view showing an example of a table indicating the relationship between the rotational speed of the rotation shutter and an exposure amount on a substrate.

FIG. 8 is a view for explaining the timing of updating a table indicating the relationship between the rotational speed of the rotation shutter and an exposure amount on a substrate.

FIG. 9 is a graph showing an example of the relationship between the rotational speed of the rotation shutter and an exposure amount on a substrate.

FIG. 10 is a view showing an example of a variable table indicating the relationship between the rotational speed of the rotation shutter and an exposure amount on a substrate.

FIG. 13 is a graph showing an example of the relationship between the rotational speed of the rotation shutter and an exposure amount on a substrate.

FIG. 14 is a view showing an example of a variable table indicating the relationship between the rotational speed of the rotation shutter and an exposure amount on a substrate.

FIG. 17 is a graph showing an example of a temporal change in illuminance with the time of use of a light source unit.

DESCRIPTION OF THE EMBODIMENTS

Figure 1:
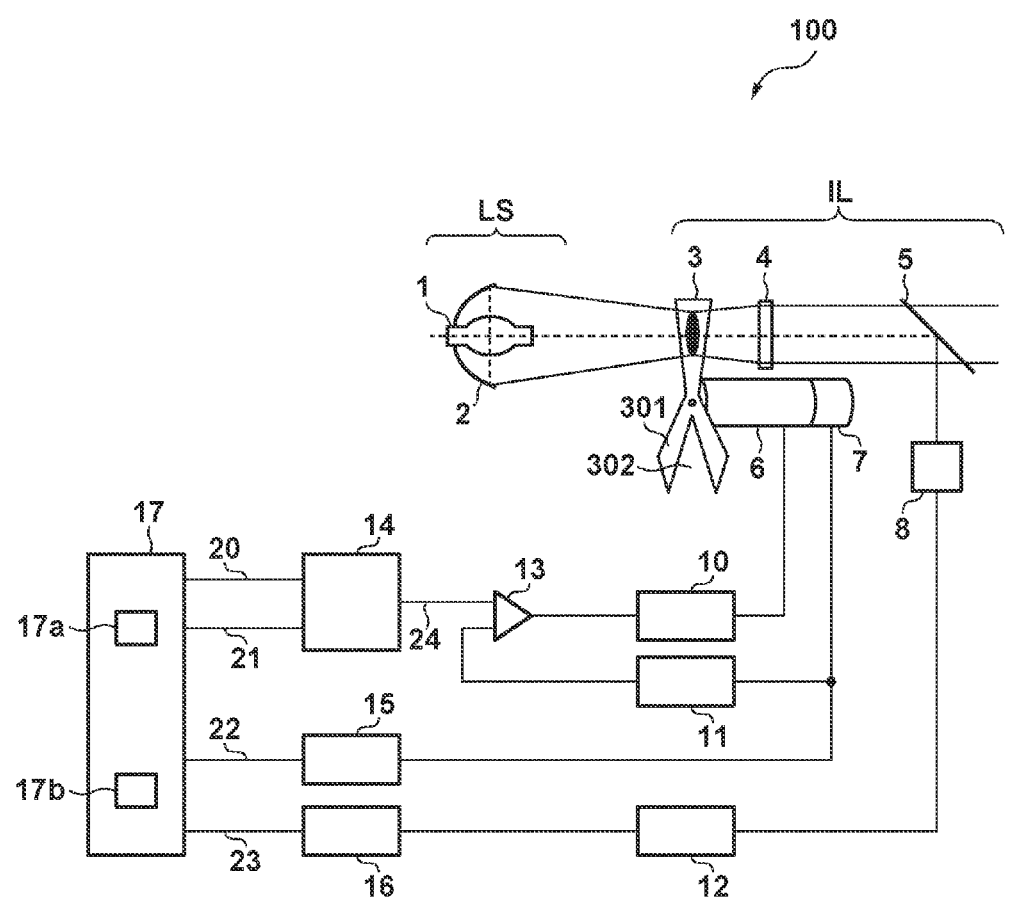
FIG. 1 is a schematic view showing the arrangement of an exposure apparatus as an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 as an aspect of the present invention. The exposure apparatus 100 is a lithography apparatus which is used for the manufacture of devices as articles such as semiconductor devices, liquid crystal display devices, and thin-film magnetic heads, and exposes substrates. In this embodiment, the exposure apparatus 100 transfers a reticle (mask) pattern onto a substrate by the stepper scheme.

The exposure apparatus 100 includes an illumination optical system IL which illuminates a reticle (not shown) with light from a light source unit LS, a projection optical system (not shown) which projects a reticle pattern onto a substrate, a detector 8, a current driver 10, a frequency voltage converter 11, and a voltage frequency converter 12. The exposure apparatus 100 also includes a servo amplifier 13, a multiplier 14, a position counter 15, an exposure amount counter 16, and a control unit 17.

The light source unit LS includes an ultraviolet lamp 1 which emits light (exposure light) for exposure of a substrate and an elliptic mirror 2 which collects light from the ultraviolet lamp 1 and guides the light to the illumination optical system IL. The illumination optical system IL includes a rotation shutter 3 which is used to control the time during which a reticle is illuminated with light from the light source unit LS, that is, to control the incident of light onto a substrate, a lens 4, a half mirror 5, a motor 6, an encoder 7.

The rotation shutter 3 is formed from a rotating body including three light-shielding portions 301 which shield light from the light source unit LS and three opening portions 302 which pass light from the light source unit LS. The motor 6 is a drive source for rotating the rotation shutter 3. The encoder 7 is a detector for detecting the rotation of the rotation shutter 3. Light passing through the rotation shutter 3 enters the half mirror 5 through the lens 4. Part of light entering the half mirror 5, for example, light reflected by the half mirror 5, is guided to the detector 8 serving as a detection unit which detects the illuminance of light from the light source unit LS or a measurement unit which measures an exposure amount on a substrate. Assume that an exposure amount is defined by the product of the illuminance of light and a time.

A current driver 10 drives the motor 6 by supplying a current to the motor 6. The FVC (Frequency Voltage Converter) 11 converts a pulse string proportional to the rotational speed of the rotation shutter 3, which is output from the encoder 7, into a voltage. The VFC (Voltage Frequency Converter) 12 converts an analog voltage proportional to an exposure amount on a substrate, which is output from the detector 8, into a pulse string.

The servo amplifier 13 supplies, to the current driver 10, an output which is proportional to the difference between the actual rotational speed of the rotation shutter 3 and a secondary command value 24 so as to match the actual rotational speed of the rotation shutter 3 with the secondary command value 24 (the rotational speed of the rotation shutter 3 which is designated by the secondary command value 24). The multiplier 14 generates the secondary command value 24 based on a primary command value 21 designating the rotational speed of the rotation shutter 3 and gain control data 20.

The position counter 15 outputs position data 22 by monitoring the rotational position of the rotation shutter 3. The exposure amount counter 16 monitors the temporal integrated amount of light entering the detector 8, that is, an exposure amount on a substrate, by counting pulses output from the VFC 12, thereby outputting exposure amount data 23.

The control unit 17 includes a CPU 17a and a memory (storage unit) 17b, and controls the entirety of the exposure apparatus 100. For example, the control unit 17 performs exposure processing to expose a shot region on a substrate by comprehensively controlling the respective units of the exposure apparatus 100. The control unit 17 drives and controls the rotation shutter 3 in the continuous driving mode. More specifically, when performing exposure processing for a shot region, the control unit 17 rotates the rotation shutter 3 so as to make a shift from the first state in which the light-shielding portion 301 shields light from the light source unit LS to the second state in which the opening portion 302 passes light from the light source unit LS and then back to the first state. Note that while exposing a shot region, the control unit 17 does not stop the rotation of the rotation shutter 3. In addition, in this embodiment, the control unit 17 decides and controls the rotational speed of the rotation shutter 3 so as to match an exposure amount on a substrate with a target exposure amount in exposure processing for a shot region on a substrate. The memory 17b stores first information indicating the relationship between the rotational speed of the rotation shutter 3 and an exposure amount on a substrate when the rotation shutter 3 is rotated at the rotational speed to make a shift from the first state to the second state and then back to the first state without stopping the rotation of the rotation shutter 3. In this case, the first information includes a table or function indicating the relationship between the rotational speed of the rotation shutter 3 and an exposure amount on a substrate.

The arrangement of the exposure apparatus 100 shown in FIG. 1 is an example, and does not limit the arrangement of the exposure apparatus 100. For example, the exposure amount counter 16 may calculate an exposure amount by inputting an analog voltage output from the detector 8 to an AD converter.

FIG. 2 is a graph showing the relationship between the driven state of the rotation shutter 3 and an illumination on a substrate in the continuous driving mode. Assume that in this case, the rotation shutter 3 starts rotating from the state in which the light-shielding portion 301 of the rotation shutter 3 completely shields light from the light source unit LS, that is, the first state. Referring to FIG. 2, immediately after the start of the rotation of the rotation shutter 3, no shift occurs to the state in which the opening portion 302 of the rotation shutter 3 passes light from the light source unit LS, that is, the second state. That is, the first state continues even after the start of the rotation of the rotation shutter 3.

When light from the light source unit LS reaches an end portion of the light-shielding portion 301, the light gradually passes through the opening portion 302. When an end portion of the light on the opposite side reaches an end portion of the light-shielding portion 301, a shift occurs to the state in which the opening portion 302 completely passes light, that is, the second state. When the end portion of light from the light source unit LS reaches an end portion of the next light-shielding portion 301 of the rotation shutter 3, a shift starts to occur to the first state, and the end portion of the light on the opposite side is covered by the light-shielding portion 301 to completely shield the light. As a result, the first state is set again.

FIG. 2 also shows a graph indicating exposure amounts on a substrate in the continuous driving mode. This graph indicates the illuminance of light entering a substrate along the ordinate, and the time along the abscissa. As described above, the integrated value of illuminance of light entering a substrate becomes an exposure amount on the substrate. In the continuous driving mode, a series of operations from the first state to the first state through the second state is performed by rotating the rotation shutter 3 once without stopping the rotation of the rotation shutter 3. Therefore, an exposure amount on a substrate in the continuous driving mode is determined by the rotational speed of the rotation shutter 3 and the illuminance of light from the light source unit LS in a state in which the opening portion 302 of the rotation shutter 3 passes light from the light source unit LS.

On the other hand, since the illuminance of light from the light source unit LS including the ultraviolet lamp 1 temporally changes, the exposure amount also changes in accordance with illuminance under the condition that the rotational speed of the rotation shutter 3 remains the same. For this reason, in this embodiment, in the continuous driving mode, in order to maintain the accuracy of an exposure amount on a substrate (that is, to accurately control an exposure amount on a substrate), second information concerning the illuminance of light from the light source unit LS is obtained and fed back for the driving of the rotation shutter 3. This makes it possible to control the rotational speed of the rotation shutter 3 so as to match an exposure amount on a substrate with a target exposure amount in exposure processing for a shot region on the substrate. In this case, as will be described later, the second information includes at least one of a temporal change in an exposure amount on a substrate and a temporal change in the illuminance of light from the light source unit LS. Each embodiment described below will specifically exemplify control on the rotation shutter 3 so as to maintain the accuracy of an exposure amount on a substrate, even when the illuminance of light from the light source unit LS has changed.

First Embodiment

When the ultraviolet lamp 1 is replaced, the relationship between the rotational speed of the rotation shutter 3 and an exposure amount on a substrate as a reference is obtained. That is, the relationship between the rotational speed of the rotation shutter 3 and an exposure amount on a substrate when the rotation shutter 3 is rotated in the continuous driving mode is obtained. FIG. 3 is a graph showing an example of the relationship between the rotational speed of the rotation shutter 3 and an exposure amount on a substrate.

Referring to FIG. 3, when the rotational speed of the rotation shutter 3 is low, since the time of the second state in which the opening portion 302 passes light from the light source unit LS is long, an exposure amount on the substrate is large. As the rotational speed of the rotation shutter 3 increases, the exposure amount on the substrate decreases. For example, when the rotation shutter 3 is rotated at a rotational speed $RVA_1$, the detector 8 measures an exposure amount $EXA_1$ on the substrate. Likewise, when the rotation shutter 3 is rotated at rotational speeds $RVB_1$, $RVC_1$, and $RVD_1$, the detector 8 detects exposure amounts $EXB_1$, $EXC_1$, and $EXD_1$ on the substrate. In this manner, in this embodiment, with respect to the rotational speeds $RVA_1$, $RVB_1$, $RVC_1$, and $RVD_1$ of the rotation shutter 3, the exposure amounts $EXA_1$, $EXB_1$, $EXC_1$, and $EXD_1$ on the substrate which correspond to the respective rotational speeds are obtained. FIG. 4 is a view showing an example of a table (first information) TB1 obtained by expressing the relationship between the rotational speed of the rotation shutter 3 and an exposure amount on the substrate, shown in FIG. 3, in the form of a table. The table TB1 shown in FIG. 4 is stored in the memory 17b of the control unit 17.

The control unit 17 (CPU 17a) can obtain an exposure amount on a substrate which corresponds to the rotational speed of the rotation shutter 3, which is not measured by the detector 8, based on the table TB1 stored in the memory 17b, by linearly interpolating exposure amounts on the substrate which are measured by the detector 8. More specifically, as shown in FIG. 3, the control unit 17 decides a linear relational expression (function) LR1 between the exposure amount $EXA_1$ corresponding to the rotational speed $RVA_1$ and the exposure amount $EXB_1$ corresponding to the rotational speed $RVB_1$. The control unit 17 can then easily obtain an exposure amount $EXAB_1$ corresponding to an arbitrary rotational speed $RVAB_1$ between the rotational speed $RVA_1$ and the rotational speed $RVB_1$ from the linear relational expression LR1.

In addition, the memory 17b stores, in addition to the table TB1, a plurality of tables TB2 and TB3 with different relationships between the rotational speeds of the rotation shutter 3 and exposure amounts on a substrate, as shown in FIGS. 5 and 6. It is possible to obtain the table TB1 shown in FIG. 3, the table TB2 shown in FIG. 5, and the table TB3 shown in FIG. 6 by changing the illuminance of light from the light source unit LS (ultraviolet lamp 1). In this embodiment, the memory 17b stores the three tables TB1, TB2, and TB3. However, the number of tables is not limited to this as long as it is two or more.

Figure 7:
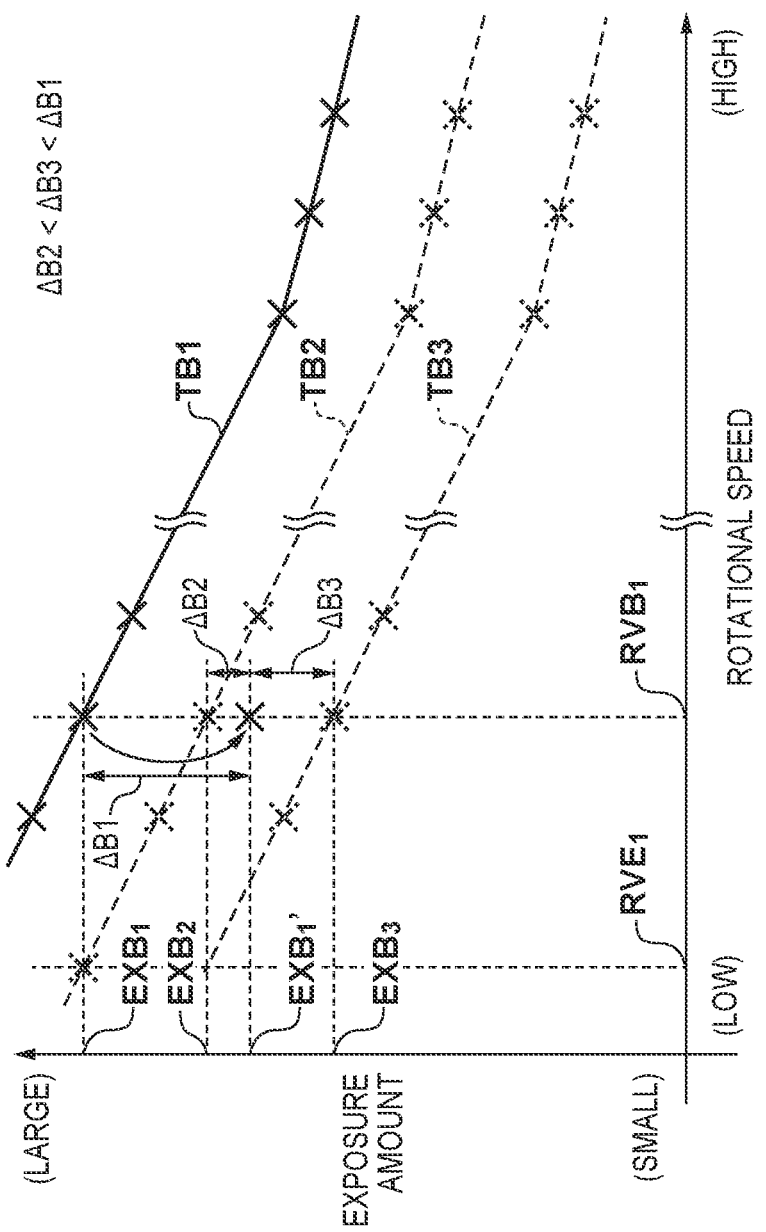
FIG. 7 is a graph showing an example of the relationship between the rotational speed of the rotation shutter and an exposure amount on a substrate.

Specific control of the rotation shutter 3 according to this embodiment will be described with reference to FIG. 7. Assume that in the following description, the exposure amount $EXB_1$ corresponding to the rotational speed $RVB_1$ of the rotation shutter 3 has changed to an exposure amount $EXB_1'$ because of a change in the illuminance of light from the light source unit LS, as shown in FIG. 7.

The control unit 17 compares the exposure amounts $EXB_1$, $EXB_2$, and $EXB_3$ corresponding to the rotational speed $RVB_1$ with the exposure amount $EXB_1'$ in tables TB1, TB2, and TB3 stored in the memory 17b, and selects a table nearest to the exposure amount $EXB_1'$. Referring to FIG. 7, $\Delta B1$ represents the difference between the exposure amount $EXB_1'$ and the exposure amount $EXB_1$, $\Delta B2$ represents the difference between the exposure amount $EXB_1'$ and the exposure amount $EXB_2$, and $\Delta B3$ represents the difference between the exposure amount $EXB_1'$ and the exposure amount $EXB_3$. In this case, if the differences $\Delta B1$, $\Delta B2$, and $\Delta B3$ have a relation of $\Delta B2 < \Delta B3 < \Delta B1$, an exposure amount nearest to the exposure amount $EXB_1'$ is the exposure amount $EXB_2$.

The control unit 17, therefore, updates a table to be used to decide the rotational speed of the rotation shutter 3 in exposure processing for a shot region on a substrate, which indicates the relationship between the rotational speed of the rotation shutter 3 and an exposure amount on the substrate, from the table TB1 to the table TB2. Assume that a target exposure amount is the exposure amount $EXB_1$. In this case, updating the table TB1 to the table TB2 makes it possible to decide (set) a rotational speed $RVE_1$ as the rotational speed of the rotation shutter 3 in exposure processing for a shot region on the substrate. It is possible to decide the rotational speed of the rotation shutter 3 corresponding to a target exposure amount by sequentially updating a table indicating the relationship between the rotational speed of the rotation shutter 3 and an exposure amount on a substrate in accordance with a change (second information) in the illuminance of light from the light source unit LS in this manner. The control unit 17 then decides and controls the rotational speed of the rotation shutter 3 to match the exposure amount on the substrate with the target exposure amount based on the updated table in exposure processing for a shot region on the substrate.

As shown in FIG. 8, the exposure apparatus 100 sequentially performs the following processing: loading a substrate, aligning the substrate held on a substrate stage, performing actual exposure to transfer a reticle pattern onto the substrate by exposure, and unloading the substrate having undergone the exposure. In addition, the exposure apparatus 100 stands by until next exposure processing (JOB) starts. As described above, exposure processing includes loading, alignment, actual exposure, unloading, and standing by. The exposure apparatus 100 repeatedly performs these processes for each shot region on the substrate.

The control unit 17 updates the table indicating the relationship between the rotational speed of the rotation shutter 3 and an exposure amount on a substrate during a period except for a period in which a shot region on the substrate is exposed. For example, the control unit 17 updates the table indicating the relationship between the rotational speed of the rotation shutter 3 and an exposure amount on a substrate during a period of loading. More specifically, the control unit 17 causes the detector 8 to measure an exposure amount on the substrate while rotating the rotation shutter 3 at a predetermined rotational speed (first rotational speed) during a period, of the period of loading, in which the substrate is not present below the projection optical system. The control unit 17 then compares the exposure amount measured by the detector 8, that is, the exposure amount corresponding to the predetermined rotational speed, with exposure amounts corresponding to the predetermined rotational speed in the tables TB1, TB2, and TB3 stored in the memory 17b, thereby updating the table.

Referring to FIG. 8, in consideration of variations in exposure amount on a substrate, an exposure amount is measured three times while the rotation shutter 3 is rotated at a predetermined rotational speed. However, the number of times of measurement of an exposure amount is not limited to this as long as it is one or more. In addition, when the exposure apparatus 100 includes a light-shielding mechanism (not shown) between the half mirror 5 and a substrate, it is possible to ensure a period in which no substrate is present below the projection optical system by causing the light-shielding mechanism to shield light from the light source unit LS.

Alternatively, the control unit 17 may update the table indicating the relationship between the rotational speed of the rotation shutter 3 and an exposure amount on a substrate during a period of alignment. During a period of alignment, the rotation shutter 3 is sometimes opened and closed, that is, the rotation shutter 3 is sometimes rotated. In this case, in general, the accuracy of an exposure amount is not required to be as high as that in actual exposure, and hence it is possible to arbitrarily decide the rotational speed of the rotation shutter 3. It is therefore possible to update the table indicating the relationship between the rotational speed of the rotation shutter 3 and an exposure amount on a substrate by measuring an exposure amount on the substrate while the rotation shutter 3 is rotated at a predetermined rotational speed during a period of alignment.

In addition, the control unit 17 can update the table indicating the relationship between the rotational speed of the rotation shutter 3 and an exposure amount on a substrate in a period of unloading as well as in a period of loading. Furthermore, the control unit 17 can update the table indicating the relationship between the rotational speed of the rotation shutter 3 and an exposure amount on a substrate in a period of standing by until the start of next exposure processing.

In each of periods of loading, unloading, and standing by, the rotational speed of the rotation shutter 3 can be freely selected, and an exposure amount on a substrate can be measured during a period in which a substrate is not present below the projection optical system as long as time allows. This can improve the measurement accuracy of an exposure amount.

In addition, when measuring an exposure amount on a substrate to update the table indicating the relationship between the rotational speed of the rotation shutter 3 and an exposure amount on a substrate, the rotation shutter 3 may be rotated at least one rotational speed. In other words, a rotational speed or the number of rotational speeds to be set for the rotation shutter 3 is not specifically limited. Note that the timing of updating the table shown in FIG. 8 is an example and not exhaustive.

A change in the illuminance of light from the light source unit LS including the ultraviolet lamp 1 is temporally moderate. Therefore, the table indicating the relationship between the rotational speed of the rotation shutter 3 and an exposure amount on a substrate may be updated at long intervals (for example, updated per several substrates). When requiring strict accuracy concerning an exposure amount, the intervals at which the table indicating the relationship between the rotational speed of the rotation shutter 3 and an exposure amount on a substrate is updated may be minimized. It is possible to select an arbitrary timing and intervals by causing the control unit 17 to manage, as parameters, timings, intervals, and the like for updating the table indicating the relationship between the rotational speed of the rotation shutter 3 and an exposure amount on a substrate.

As described above, this embodiment makes the memory 17b store a plurality of tables indicating different relationships between the rotational speed of the rotation shutter 3 and an exposure amount on a substrate. The table used to decide the rotational speed of the rotation shutter 3 in exposure processing for a shot region on a substrate is updated by selecting one of the plurality of tables stored in the memory 17b based on a change in the illuminance of light from the light source unit LS. In addition, before the rotational speed of the rotation shutter 3 in exposure processing for a shot region is decided, one table is selected based on the first exposure amount measured by the detector 8 while the rotation shutter 3 is rotated at the first rotational speed. In this case, for example, it is preferable to select a table including a relationship nearest to the relationship between the first rotational speed and the first exposure amount from the plurality of tables stored in the memory 17b.

This embodiment, therefore, makes it unnecessary to perform periodic maintenance for obtaining again a table indicating the relationship between the rotational speed of the rotation shutter 3 and an exposure amount. This makes it possible to decide the rotational speed of the rotation shutter 3 which corresponds to a target exposure amount without decreasing the operating rate of the exposure apparatus 100 even if the illuminance of light from the light source unit LS has changed. In addition, according to the embodiment, it is possible to maintain the accuracy of an exposure amount based on the rotation shutter 3 within a predetermined range without decreasing the accuracy in the continuous driving mode to update the table in accordance with a change in the illuminance of light from the light source unit LS. In this manner, the exposure apparatus 100 can satisfy both requirements for the accuracy of an exposure amount on a substrate and productivity.

Second Embodiment

This embodiment makes a memory 17b store a variable table TB4 indicating the relationship between the rotational speed of a rotation shutter 3 and an exposure amount on a substrate, and updates the relationship in the variable table TB4 stored in the memory 17b in accordance with a change in the illuminance of light from a light source unit LS. FIG. 9 is a graph showing an example of the relationship between the rotational speed of the rotation shutter 3 and an exposure amount on a substrate as a reference, that is, the relationship between the rotational speed of the rotation shutter 3 and an exposure amount on the substrate when the rotation shutter 3 is rotated in the continuous driving mode. FIG. 10 is a view showing an example of the variable table TB4 obtained by expressing the relationship between the rotational speed of the rotation shutter 3 and an exposure amount on the substrate, shown in FIG. 9, in the form of a table.

The variable table TB4 is stored in the memory 17b as described above. A control unit 17 decides and controls the rotational speed of the rotation shutter 3 so as to match an exposure amount on the substrate with a target exposure amount based on the variable table TB4 stored in the memory 17b in exposure processing for a shot region on the substrate. In addition, as described above, the control unit 17 can obtain an exposure amount corresponding to an arbitrary rotational speed based on a linear relational expression between the rotational speed of the rotation shutter 3 and an exposure amount on the substrate, which is obtained from the variable table TB4.

Figures 11, 12:
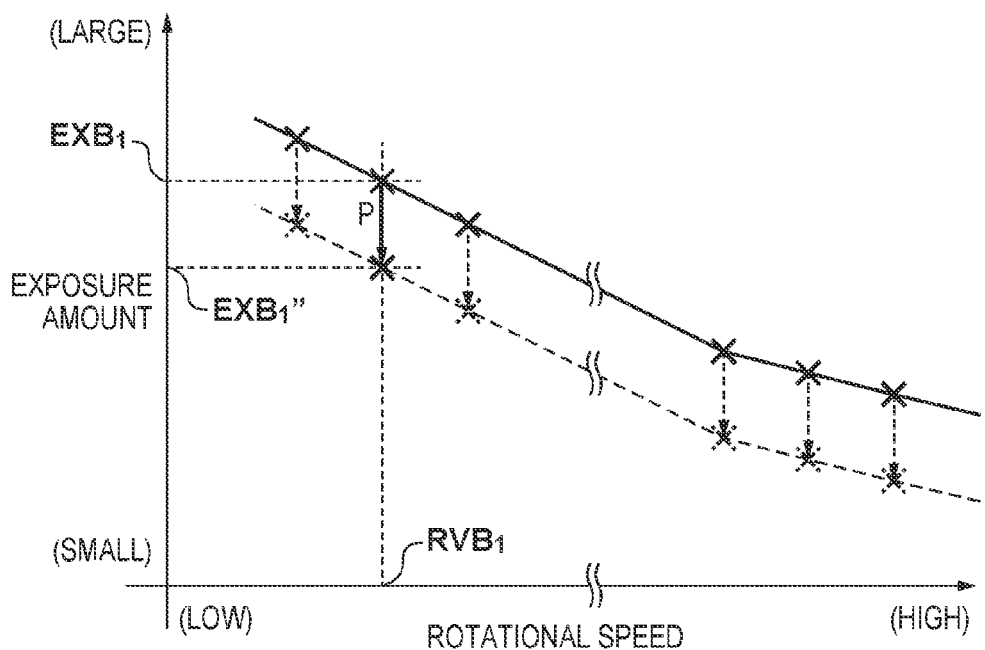
FIG. 11 is a graph showing an example of the relationship between the rotational speed of the rotation shutter and an exposure amount on a substrate.
FIG. 12 is a view showing an example of a variable table indicating the relationship between the rotational speed of the rotation shutter and an exposure amount on a substrate.

Specific control of the rotation shutter 3 according to this embodiment will be described with reference to FIGS. 11 and 12. Assume that in the following description, an exposure amount $EXB_1$ corresponding to a rotational speed $RVB_1$ of the rotation shutter 3 has changed to an exposure amount $EXB_1"$ because of a change in the illuminance of light from the light source unit LS, as shown in FIG. 11. FIG. 12 is a view showing an example of the variable table TB4 indicating the relationship between the rotational speed of the rotation shutter 3 and an exposure amount on a substrate.

The control unit 17 updates the exposure amount $EXB_1$ corresponding to the rotational speed $RVB_1$ in the variable table TB4 shown in FIG. 10 to the exposure amount $EXB_1"$. In addition, the rate of change (ratio) P between the exposure amount $EXB_1$ and the exposure amount $EXB_1"$ is reflected in exposure amounts respectively corresponding to other rotational speeds, for example, rotational speeds $RVA_1$, $RVC_1$, and $RVD_1$. More specifically, the change of rate P is reflected in an exposure amount $EXA_1$ corresponding to the rotational speed $RVA_1$ in the variable table TB4 shown in FIG. 10 to update it to an exposure amount $EXA_1"$ ($=EXA_1 \times P$). Likewise, the change of rate P is reflected in exposure amounts $EXC_1$ and $EXD_1$ respectively corresponding to the rotational speeds $RVC_1$ and $RVD_1$ in the variable table TB4 shown in FIG. 10 to update them to exposure amounts $EXC_1"$ ($=EXC_1 \times P$) and $EXD_1"$ ($=EXD_1 \times P$). It is possible to decide the rotational speed of the rotation shutter 3 corresponding to a target exposure amount by sequentially updating the relationship between the rotational speed of the rotation shutter 3 and an exposure amount on a substrate in the variable table TB4 in accordance with a change in the illuminance of light from the light source unit LS. The control unit 17 then decides and controls the rotational speed of the rotation shutter 3 so as to match an exposure amount on the substrate with a target exposure amount based on the updated variable table TB4 in exposure processing for a shot region on the substrate. Note that the timing of updating the relationship between the rotational speed of the rotation shutter 3 and an exposure amount on a substrate in the variable table TB4 is the same as that in the first embodiment, and hence a detailed description of it will be omitted.

As described above, this embodiment makes the memory 17b store a variable table in which the relationship between the rotational speed of the rotation shutter 3 and an exposure amount on a substrate can be changed. The variable table to be used to decide the rotational speed of the rotation shutter 3 in exposure processing for a shot region on a substrate is updated based on a change in the illuminance of light from the light source unit LS. For example, before the rotational speed of the rotation shutter 3 in exposure processing for a shot region is decided, the rate of change between an exposure amount measured by a detector 8 while the rotation shutter 3 is rotated at the first rotational speed and an exposure amount corresponding to the first rotational speed in the variable table before update is obtained. The variable table is then updated by reflecting the rate of change in the relationship between the rotational speed of the rotation shutter 3 and an exposure amount on a substrate in the variable table.

In this embodiment, therefore, it is only necessary to prepare one variable table in which the relationship between the rotational speed of the rotation shutter 3 and an exposure amount on a substrate can be updated. This makes it easy to manage the table as compared with the first embodiment. In addition, since an actual change in exposure amount on a substrate which is caused by a change in the illuminance of light from the light source unit LS can be reflected in the relationship between the rotational speed of the rotation shutter 3 and an exposure amount on a substrate, the rotational speed of the rotation shutter 3 corresponding to a target exposure amount can be more accurately obtained.

Third Embodiment

In the first and second embodiments, when updating the table indicating the relationship between the rotational speed of the rotation shutter 3 and an exposure amount on a substrate, a temporal change in exposure amount on the substrate is used as the second information concerning a change in the illuminance of light from the light source unit LS. Note however that a temporal change in the illuminance of light from the light source unit LS may be used as the second information concerning a change in the illuminance of light from the light source unit LS.

FIG. 13 a graph showing an example of the relationship between the rotational speed of a rotation shutter 3 and an exposure amount on a substrate as a reference, that is, the relationship between the rotational speed of the rotation shutter 3 and an exposure amount on the substrate when the rotation shutter 3 is rotated in the continuous driving mode. FIG. 14 is a view showing an example of a variable table TB5 obtained by expressing the relationship between the rotational speed of the rotation shutter 3 and an exposure amount on a substrate shown in FIG. 13 in the form of a table. The variable table TB5 is stored in a memory 17b in association with illuminance (first illuminance) S1 of light from a light source unit LS as a reference when a variable table TB5 is obtained. When performing exposure processing for a shot region on a substrate, a control unit 17 decides and controls the rotational speed of the rotation shutter 3 so as to match an exposure amount on the substrate with a target exposure amount based on the variable table TB5 stored in the memory 17b. In addition, as described above, the control unit 17 can also obtain an exposure amount corresponding to an arbitrary rotational speed based on a linear relational expression between the rotational speed of the rotation shutter 3 and an exposure amount on the substrate, which is obtained from the variable table TB5.

Figures 15, 16:
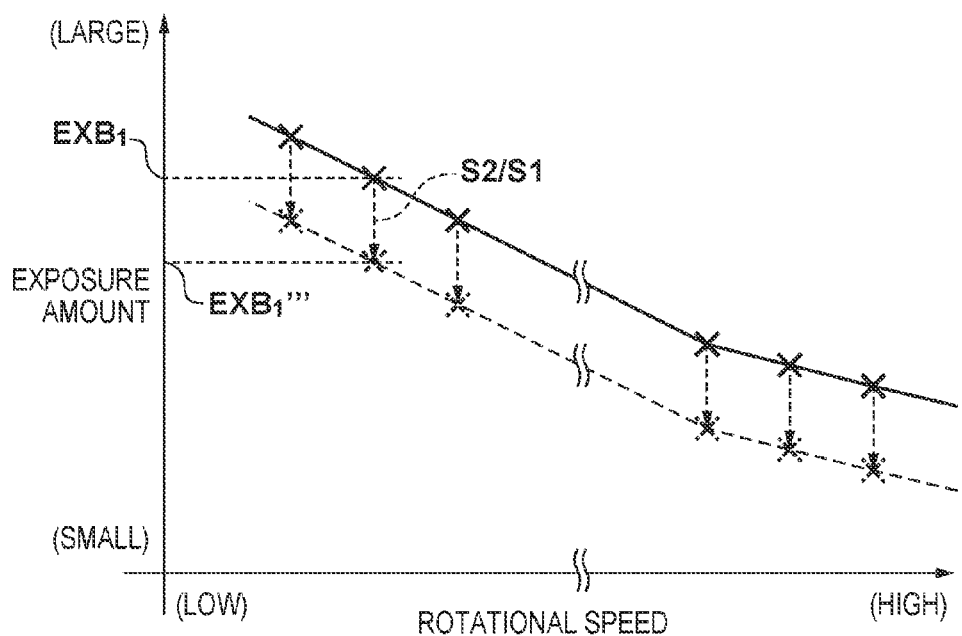
FIG. 15 is a graph showing an example of the relationship between the rotational speed of the rotation shutter and an exposure amount on a substrate.
FIG. 16 is a view showing an example of a variable table indicating the relationship between the rotational speed of the rotation shutter and an exposure amount on a substrate.

Specific control of the rotation shutter 3 according to this embodiment will be described with reference to FIGS. 15 and 16. Assume that in the following description, an illuminance S1 of light from the light source unit LS has changed to an illuminance S2, as shown in FIG. 15. FIG. 16 is a view showing an example of the variable table TB5 in which the relationship between the rotational speed of the rotation shutter 3 and an exposure amount on a substrate has been updated.

In an exposure apparatus 100, a detector 8 can detect the illuminance of light from the light source unit LS regardless of the rotational speed of the rotation shutter 3. It is therefore possible to detect the illuminance of light from the light source unit LS at an arbitrary timing in the second state in which an opening portion 302 of the rotation shutter 3 passes light from the light source unit LS. For example, in order to prevent a decrease in the operating rate of the exposure apparatus 100, the illuminance of light may be detected at the timing of measuring an exposure amount on a substrate as in the first embodiment or may be detected at the time of actual exposure.

The control unit 17 updates an exposure amount $EXB_1$ in the variable table TB5 shown in FIG. 14 to an exposure amount $EXB_1'''$ ($=EXB_1 \times S2/S1$) by reflecting a rate of change (ratio) S2/S1 between an illuminance S1 and an illuminance S2 in the exposure amount $EXB_1$. The same applies to exposure amounts $EXA_1$, $EXC_1$, and $EXD_1$ in the variable table TB5 shown in FIG. 14. The control unit 17 respectively updates the exposure amounts $EXA_1$, $EXC_1$, and $EXD_1$ to exposure amounts $EXA_1'''$ ($=EXA_1 \times S2/S1$), $EXC_1'''$ ($=EXC_1 \times S2/S1$), and $EXD_1'''$ ($=EXD_1 \times S2/S1$) by reflecting the rate of change S2/S1 in the exposure amounts $EXA_1$, $EXC_1$, and $EXD_1$. It is possible to decide the rotational speed of the rotation shutter 3 corresponding to a target exposure amount by sequentially updating the relationship between the rotational speed of the rotation shutter 3 and an exposure amount on a substrate in the variable table TB5 in accordance with a change in the illuminance of light from the light source unit LS. The control unit 17 then decides and controls the rotational speed of the rotation shutter 3 so as to match an exposure amount on the substrate with a target exposure amount based on the updated variable table TB5 in exposure processing for a shot region on the substrate.

As described above, this embodiment makes the memory 17b store a variable table in which the relationship between the rotational speed of the rotation shutter 3 and an exposure amount on a substrate can be updated in association with the illuminance (first illuminance) of light from the light source unit LS at that time. The variable table to be used to decide the rotational speed of the rotation shutter 3 in exposure processing for a shot region on a substrate is updated based on a change in the illuminance of light from the light source unit LS. For example, before the rotational speed of the rotation shutter 3 in exposure processing for a shot region is decided, the rate of change between the illuminance of light (second illuminance) from the light source unit LS detected by the detector 8 and the first illuminance associated with the variable table before update is obtained. The variable table is then updated by reflecting the rate of change in the relationship between the rotational speed of the rotation shutter 3 and an exposure amount on a substrate in the variable table.

In this embodiment, therefore, it is possible to obtain the relationship between the rotational speed of the rotation shutter 3 and an exposure amount on a substrate at the illuminance of light from the light source unit LS when updating the variable table. In addition, in the embodiment, since a detection result on the illuminance of light from the light source unit LS is used, the variable table can be updated at an arbitrary timing in the second state in which the opening portion 302 passes light from the light source unit LS, regardless of the rotational speed of the rotation shutter 3.

Fourth Embodiment

The third embodiment has exemplified the case in which the variable table stored in the memory 17b is updated based on the illuminance of light from the light source unit LS which is detected by the detector 8. Note however that the illuminance of light from the light source unit LS including the ultraviolet lamp 1 generally tends to decrease in accordance with the time of use.

FIG. 17 is a graph showing an example of a temporal change in illuminance with the time of use of a light source unit LS. Referring to FIG. 17, the abscissa represents the time of use of the light source unit LS, and the ordinate represents the maintenance factor of the illuminance of light from the light source unit LS. Although the tendency of decrease in illuminance differs depending on the light source unit LS, that is, the type of ultraviolet lamp 1, the current illuminance of light from the light source unit LS can be estimated from the initial illuminance and the time of use, as shown in FIG. 17.

In this embodiment, therefore, a control unit 17 obtains the current illuminance of light from the light source unit LS based on the initial illuminance of light from the light source unit LS and the time of use of the light source unit LS. As in the third embodiment, the control unit 17 then updates the variable table stored in a memory 17b by reflecting the rate of change (ratio) between the first illuminance associated with the variable table before update and the current illuminance in exposure amounts in the variable table.

Fifth Embodiment

A method of manufacturing an article according to an embodiment of the present invention is suitable for manufacturing an article such as a device (for example, a semiconductor device, magnetic storage medium, or liquid crystal display device). This method of manufacturing includes a step of exposing a substrate coated with a photosensitizing agent by using an exposure apparatus 100 and a step of developing the exposed substrate. The method of manufacturing further includes other known steps (oxidation, film formation, deposition, doping, planarization, etching, resist removal, dicing, bonding, packaging, and the like). The method of manufacturing an article according to this embodiment is superior to the conventional method in at least one of the performance of an article, quality, productivity, and production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-121423 filed on Jun. 16, 2015, which is hereby incorporated by reference herein in its entirety.

What is claimed is:

1. An exposure apparatus which exposes a substrate with light from a light source, the apparatus comprising:
   a rotation shutter including a light-shielding portion which shields the light and configured to control incidence of the light onto the substrate; and
   a control unit configured to control a rotational speed of the rotation shutter so as to match an exposure amount on the substrate with a target exposure amount in exposure processing for a shot region on the substrate, based on first information indicating a relationship between a rotational speed of the rotation shutter and an exposure amount on the substrate when rotating the rotation shutter at the rotational speed without stopping rotation of the rotation shutter so as to make a shift from a first state in which the rotation shutter shields the light to a second state in which the rotation shutter passes the light and then back to the first state,
   wherein the control unit updates the first information based on second information concerning a change in the illuminance of the light.

2. The apparatus according to claim 1, further comprising a storage unit configured to store a plurality of pieces of first information with the relationships differing from each other,
   wherein the control unit performs the updating by selecting, based on the second information, one piece of first information from the plurality of pieces of first information stored in the storage unit.

3. The apparatus according to claim 2, further comprising a measurement unit configured to measure an exposure amount on the substrate,
   wherein the control unit selects the one piece of first information from the plurality of pieces of first information based on a first rotational speed and a first exposure amount measured by the measurement unit while the rotation shutter is rotated at the first rotational speed before decision of a rotational speed of the rotation shutter in exposure processing for the shot region.

4. The apparatus according to claim 3, wherein the control unit selects, as the one piece of first information, first information, of the plurality of pieces of first information, which includes a relationship nearest to the relationship between the first rotational speed and the first exposure amount.

5. The apparatus according to claim 1, further comprising a measurement unit configured to measure an exposure amount on the substrate,
   wherein the control unit performs the updating by reflecting, in the relationship, a rate of change between an exposure amount measured by the measurement unit while the rotation shutter is rotated at a first rotational speed and an exposure amount on the substrate which corresponds to the first rotational speed before a rotational speed of the rotation shutter is decided in exposure processing for the shot region.

6. The apparatus according to claim 1, further comprising a detection unit configured to detect an illuminance of the light,
   wherein the first information includes information when an illuminance of the light is first illuminance, and
   the control unit performs the updating by reflecting, in the relationship, a rate of change between a second illuminance of the light detected by the detection unit and the first illuminance before decision of a rotational speed of the rotation shutter in exposure processing for the shot region.

7. The apparatus according to claim 1, wherein the first information includes information when an illuminance of the light is first illuminance, and
   the control unit obtains a current illuminance of the light based on an initial illuminance of the light and a time of use of the light source, and performs the updating by reflecting a rate of change between the current illuminance and the first illuminance in the relationship.

8. The apparatus according to claim 1, wherein the first information includes one of a table and a function which indicates the relationship.

9. The apparatus according to claim 1, wherein the second information includes at least one of a temporal change in exposure amount on the substrate and a temporal change in illuminance of the light.

10. The apparatus according to claim 1, wherein the control unit performs the updating during a period except for a period in which the shot region is exposed.

11. The apparatus according to claim 1, wherein the control unit updates the first information based on second information concerning a decrease in the illuminance of the light.

12. A method of manufacturing an article, the method comprising:
exposing a substrate with light from a light source using an exposure apparatus; and
developing the exposed substrate,
wherein the exposure apparatus includes:
a rotation shutter including a light-shielding portion which shields the light and configured to control incidence of the light onto the substrate; and
a control unit configured to control a rotational speed of the rotation shutter so as to match an exposure amount on the substrate with a target exposure amount in exposure processing for a shot region on the substrate, based on first information indicating a relationship between a rotational speed of the rotation shutter and an exposure amount on the substrate when rotating the rotation shutter at the rotational speed without stopping rotation of the rotation shutter so as to make a shift from a first state in which the rotation shutter shields the light to a second state in which the rotation shutter passes the light and then back to the first state,
wherein the control unit updates the first information based on second information concerning a change in the illuminance of the light.

* * * * *